(12) United States Patent
Natori et al.

(10) Patent No.: US 11,282,681 B2
(45) Date of Patent: Mar. 22, 2022

(54) SEMICONDUCTOR MANUFACTURING APPARATUS AND METHOD OF MANUFACTURING SEMICONDUCTOR DEVICE

(71) Applicant: KIOXIA CORPORATION, Tokyo (JP)

(72) Inventors: Katsuaki Natori, Yokkaichi Mie (JP); Hiroshi Toyoda, Yokkaichi Mie (JP); Masayuki Kitamura, Yokkaichi Mie (JP); Takayuki Beppu, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 204 days.

(21) Appl. No.: 16/553,982

(22) Filed: Aug. 28, 2019

(65) Prior Publication Data

US 2020/0258722 A1    Aug. 13, 2020

(30) Foreign Application Priority Data

Feb. 7, 2019   (JP) .............................. JP2019-020713

(51) Int. Cl.
| | |
|---|---|
| *H01L 21/285* | (2006.01) |
| *H01J 37/32* | (2006.01) |
| *H01L 27/11582* | (2017.01) |
| *H01L 21/673* | (2006.01) |
| *C23C 16/455* | (2006.01) |

(Continued)

(52) U.S. Cl.
CPC ........ *H01J 37/32862* (2013.01); *C23C 16/06* (2013.01); *C23C 16/4405* (2013.01); *C23C 16/4584* (2013.01); *C23C 16/45565* (2013.01); *H01L 21/28568* (2013.01); *H01L 21/6732* (2013.01); *H01L 27/11582* (2013.01); *H01L 29/40117* (2019.08); *H01J 2237/3321* (2013.01)

(58) Field of Classification Search
None
See application file for complete search history.

(56) References Cited

U.S. PATENT DOCUMENTS

| 5,043,299 A | 8/1991 | Chang et al. |
|---|---|---|
| 2004/0231706 A1 | 11/2004 | Bhatnagar et al. |

(Continued)

FOREIGN PATENT DOCUMENTS

| JP | H07-105365 B2 | 11/1995 |
|---|---|---|
| JP | 2006-324663 A | 11/2006 |

(Continued)

OTHER PUBLICATIONS

Takatoshi Hijikata et al., "Novel Chlorination of Zirconium Dioxide At Low Temperature", Electrochemistry—Tokyo, 2009, vol. 77, No. 8, pp. 702-708.

(Continued)

*Primary Examiner* — Jack S Chen
(74) *Attorney, Agent, or Firm* — Kim & Stewart LLP

(57) ABSTRACT

A method of manufacturing a semiconductor device includes placing a substrate in a housing, supplying first gas containing molybdenum to the housing to form a film that contains molybdenum, on the substrate, removing the substrate with the formed film from the hosing, and then supplying second gas containing chlorine to the housing to remove molybdenum deposited on a surface of the housing.

10 Claims, 8 Drawing Sheets

(51) Int. Cl.
*C23C 16/06* (2006.01)
*C23C 16/44* (2006.01)
*C23C 16/458* (2006.01)
*H01L 21/28* (2006.01)

(56) References Cited

U.S. PATENT DOCUMENTS

| | | |
|---|---|---|
| 2006/0254613 A1 | 11/2006 | Wu et al. |
| 2007/0006893 A1 | 1/2007 | Ji |
| 2016/0348234 A1 | 12/2016 | Suzuki et al. |
| 2016/0351402 A1 | 12/2016 | Suzuki et al. |
| 2018/0277631 A1 | 9/2018 | Okumura |
| 2019/0259621 A1 | 8/2019 | Natori et al. |
| 2020/0091080 A1 | 3/2020 | Wakatsuki et al. |
| 2020/0258722 A1* | 8/2020 | Natori ............... H01L 27/11556 |
| 2021/0242026 A1* | 8/2021 | Kuribayashi ........... C23C 16/14 |

FOREIGN PATENT DOCUMENTS

| | | |
|---|---|---|
| JP | 2007-016315 A | 1/2007 |
| JP | 2018-163963 A | 10/2018 |
| TW | 200428479 A | 12/2004 |

OTHER PUBLICATIONS

Yu M. Korolev et al., "Reduction of Molybdenum Hexafluoride on the Internal Surface of Tubes", Russ. Metall.,1978, vol. 5, pp. 31-36.
Noboru Yoshikawa et al., "Chemical Vapour Deposition Rate of MO Film in Horizontal Tubular Reactor", Materials Transactions, JIM, 1997, vol. 38, No. 4, pp. 292-298.

* cited by examiner

SEMICONDUCTOR MANUFACTURING APPARATUS AND METHOD OF MANUFACTURING SEMICONDUCTOR DEVICE

CROSS-REFERENCE TO RELATED APPLICATION

This application is based upon and claims the benefit of priority from Japanese Patent Application No. 2019-020713, filed Feb. 7, 2019, the entire contents of which are incorporated herein by reference.

FIELD

Embodiments described herein relate generally to a semiconductor manufacturing apparatus and a method of manufacturing a semiconductor device.

BACKGROUND

Using molybdenum to form a metal layer over a substrate may cause deposition of molybdenum on an integral part of a semiconductor manufacturing apparatus, such as an inner wall of the semiconductor manufacturing apparatus and a component in the semiconductor manufacturing apparatus. The deposited molybdenum may cause deposition of particles on the substrate.

DETAILED DESCRIPTION

Embodiments provide a semiconductor manufacturing apparatus directed to solving a problem due to deposition of molybdenum and also provide a method of manufacturing a semiconductor device.

In general, according to an embodiment, a method of manufacturing a semiconductor device includes placing a substrate in a housing, supplying first gas containing molybdenum to the housing to form a film that contains molybdenum, on the substrate, removing the substrate with the formed film from the hosing, and then supplying second gas containing chlorine to the housing to remove molybdenum deposited on a surface of the housing.

Hereinafter, embodiments of the present disclosure will be described with reference to the drawings. In FIGS. 1 to 14, the same or similar components are denoted by the same symbols, and the same explanation is not repeated.

First Embodiment

Figure 1:
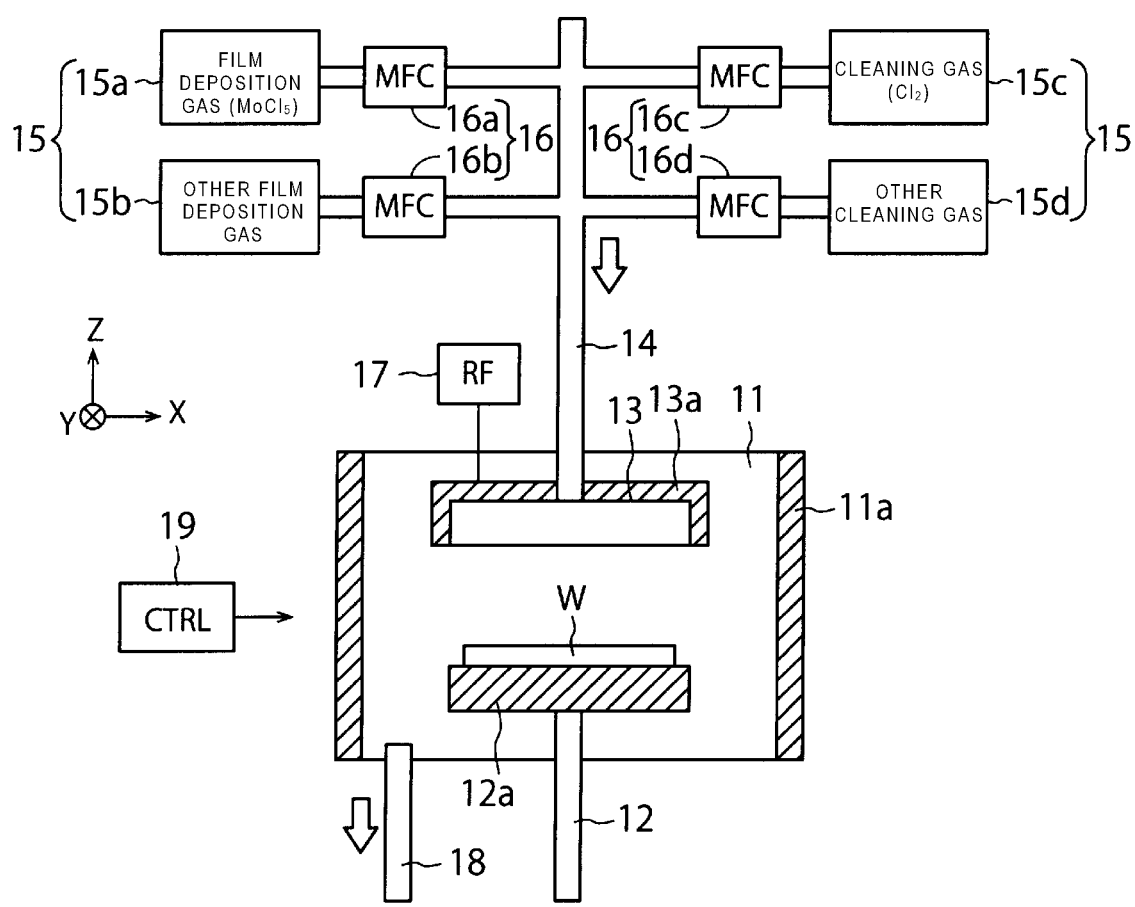
FIG. 1 schematically illustrates a structure of a semiconductor manufacturing apparatus according to a first embodiment.

FIG. 1 schematically illustrates a structure of a semiconductor manufacturing apparatus according to a first embodiment. The semiconductor manufacturing apparatus illustrated in FIG. 1 is, for example, a single-wafer chemical vapor deposition (CVD) apparatus.

The semiconductor manufacturing apparatus illustrated in FIG. 1 includes a CVD chamber 11, a wafer stage 12, a showerhead 13, a gas introduction piping 14, multiple gas supply sources 15, multiple mass flow controllers (MFCs) 16, a radio frequency (RF) power source 17, a gas discharge piping 18, and a controller 19. The CVD chamber 11 is an example of a housing.

The CVD chamber 11, the wafer stage 12, and the showerhead 13 have heaters 11a, 12a, and 13a, respectively. The multiple gas supply sources 15 include gas supply sources 15a and 15b for film deposition gas and gas supply sources 15c and 15d for cleaning gas. The multiple MFCs 16 include MFCs 16a and 16b for the film deposition gas and MFCs 16c and 16d for the cleaning gas. Among these gas supply sources 15 and the MFCs 16, the gas supply source 15a and the MFC 16a are examples that make up a first gas supply section, and the gas supply source 15c and the MFC 16c are examples that make up a second gas supply section.

The CVD chamber 11 houses a wafer W as a substrate. The wafer stage 12 supports and rotates the wafer W in the CVD chamber 11. The heater 11a is used to heat an inner wall of the CVD chamber 11 and a space in the CVD chamber 11. The inner wall of the CVD chamber 11 is an example of a structural member of the housing. The heater 11a may also function to heat the gas discharge piping 18. The heater 12a is used to heat the wafer stage 12 itself and the wafer W on the wafer stage 12. The wafer stage 12 is an example of a component in the housing.

FIG. 1 illustrates an X direction and a Y direction that are parallel to a surface of the wafer W and that are mutually perpendicular and also illustrates a Z direction that is perpendicular to the surface of the wafer W. In this specification, +Z direction is assumed as an upper direction, whereas −Z direction is assumed as a lower direction. The −Z direction may or may not be the gravity direction.

The showerhead 13 is provided in the CVD chamber 11 and supplies gas from the gas introduction piping 14 to the CVD chamber 11. The wafer stage 12 and the showerhead 13 also respectively function as lower electrode and upper electrode that apply voltage to the gas in the CVD chamber 11. The heater 13a is used to heat the showerhead 13. The showerhead 13 is an example of the component in the housing.

The gas supply sources 15a and 15b supply the film deposition gas to the CVD chamber 11 via the gas introduction piping 14. Specifically, the gas supply source 15a supplies a first gas containing molybdenum, for example, $MoF_6$ gas, $MoCl_5$ gas, or $Mo(CO)_6$ gas. The symbols Mo, F, Cl, C, and O respectively denote molybdenum, chlorine, fluorine, carbon, and oxygen. The gas supply source 15b supplies other gas, for example, $H_2$ gas. The symbol H denotes hydrogen. Each of the gas supply sources 15a and 15b includes, for example, a gas tank and a unit related to the gas tank.

When the gas supply sources 15a and 15b supply $MoF_6$ gas and $H_2$ gas to the CVD chamber 11, $MoF_6$ gas and $H_2$ gas react with each other, thereby forming a Mo film over the wafer W as a metal layer. At this time, the Mo film is deposited on a surface of the inner wall of the CVD chamber 11 and surfaces of the components in the CVD chamber 11, such as of the wafer stage 12 and of the showerhead 13. Moreover, when residues and reaction products of these gas are discharged from the CVD chamber 11 to the gas discharge piping 18, the Mo film is also deposited on a surface of the gas discharge piping 18.

The gas supply sources 15c and 15d supply the cleaning gas to the CVD chamber 11 via the gas introduction piping 14. Specifically, the gas supply source 15c supplies a second gas containing chlorine, for example, $Cl_2$ gas. The vapor pressure of the second gas is desirably 10 torr or higher at 150° C. The second gas may be HCl gas. The gas supply source 15d supplies other gas, for example, at least either one of $H_2$ gas and $O_2$ gas. Each of the gas supply sources 15c and 15d includes, for example, a gas tank and a unit related to the gas tank. The gas supply sources 15b and 15d may have respective gas sources as $H_2$ gas sources or may have a common gas source as the $H_2$ gas source.

After the wafer W with the formed Mo film is taken out of the CVD chamber 11, the gas supply sources 15c and 15d supply a mixed gas containing $Cl_2$ gas and at least either one of $H_2$ gas and $O_2$ gas to the CVD chamber 11. As a result, the Mo film deposited on the inner wall of the CVD chamber 11 and other components reacts with the $Cl_2$ gas to form molybdenum chloride, thereby being removed from the inner wall of the CVD chamber and other components. Thus, the semiconductor manufacturing apparatus of the first embodiment is cleaned. In addition, when residues and reaction products of these gas are discharged from the CVD chamber 11 to the gas discharge piping 18, the Mo film is also removed from the surface of the gas discharge piping 18.

Adding $H_2$ gas to the $Cl_2$ gas accelerates the reaction between the Mo film and the $Cl_2$ gas. The ratio or the partial pressure ratio of the $H_2$ gas in the mixed gas is desirably less than or equal to 1%. Adding $O_2$ gas to the $Cl_2$ gas increases vapor pressure of the reaction product of the reaction between the Mo film and the $Cl_2$ gas. The ratio or the partial pressure ratio of the $O_2$ gas in the mixed gas is desirably less than or equal to 50%. Details of these $H_2$ gas and $O_2$ gas will be described later.

The MFCs 16a to 16d control flow rates of gases from the gas supply sources 15a to 15d, respectively. This enables controlling the flow rates of these gas and the pressures in the CVD chamber 11 of these gas. The MFCs 16a to 16d desirably have structures suitable for the types of the gases from the gas supply sources 15a to 15d, respectively. For example, the MFC 16c receives $Cl_2$ gas from the gas supply source 15c, and therefore, the MFC 16c and piping therearound are desirably made of materials with resistance to $Cl_2$ gas.

The RF power source 17 applies high-frequency power between the lower electrode and the upper electrode, that is, between the wafer stage 12 and the showerhead 13. Thus, voltage is applied to the gas in the CVD chamber 11. For example, applying the voltage to the mixed gas at the time of cleaning the semiconductor manufacturing apparatus accelerates the reaction between the Mo film and the $Cl_2$ gas.

The gas discharge piping 18 is used to discharge the gas from the CVD chamber 11. As described above, the gas discharge piping 18 is used, for example, after the Mo film is formed over the wafer W and after the semiconductor manufacturing apparatus is cleaned.

The controller 19 controls various operations of the semiconductor manufacturing apparatus. An example of the controller 19 includes a processor, an electric circuit, and a personal computer (PC). The controller 19 controls, for example, carrying the wafer W into the CVD chamber 11, carrying the wafer W out from the CVD chamber 11, elevating and rotating the wafer stage 12, supplying gases from the gas supply sources 15, operations of the MFCs 16, and operation of the RF power source 17.

The controller 19 also controls operations of the heaters 11a, 12a, and 13a at the time of cleaning the semiconductor manufacturing apparatus. Specifically, the controller 19 controls the heaters 11a, 12a, and 13a to heat the inner wall of the CVD chamber 11, the space in the CVD chamber 11, the wafer stage 12, the showerhead 13, and the gas discharge piping 18 to 50° C. or higher. This can prevent re-deposition of molybdenum chloride on the inner wall of the CVD chamber 11 and other components. Details of these heatings will be described later.

FIGS. 2 to 11 are cross-sectional views of a structure to illustrate a method of manufacturing a semiconductor device according to the first embodiment in this order. The semiconductor device of the first embodiment is, for example, a three-dimensional semiconductor memory, and the semiconductor device is manufactured by the semiconductor manufacturing apparatus illustrated in FIG. 1.

Figure 2:
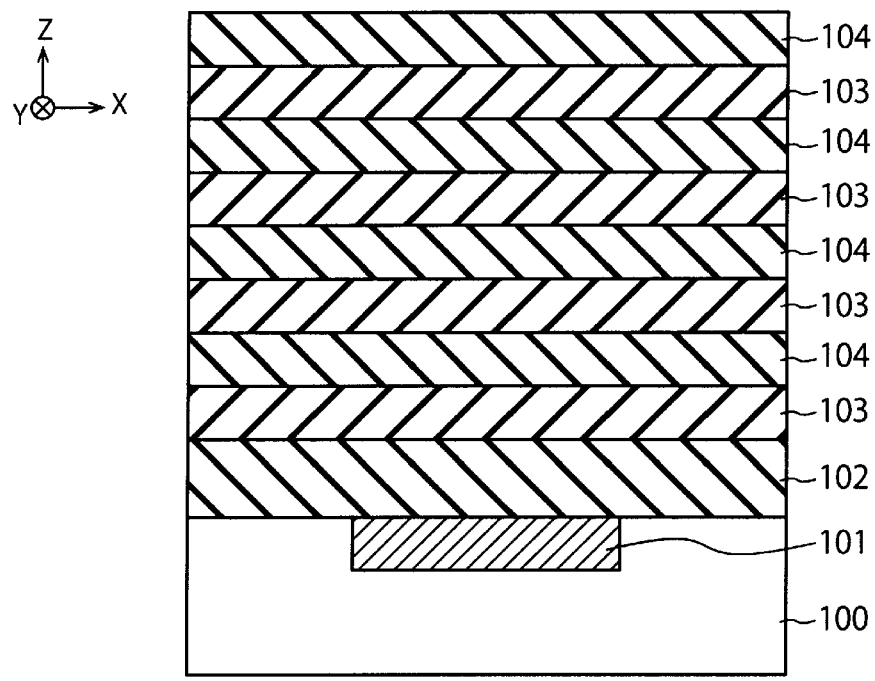
FIGS. 2-11 illustrate cross-sectional views of a structure to illustrate a method of manufacturing a semiconductor device according to the first embodiment in this order.

First, a diffusion layer 101 that is connected to a select transistor is formed in the substrate 100, an interlayer insulating film 102 is formed on the substrate 100, and multiple sacrifice layers 103 and multiple insulating layers 104 are stacked alternately on the interlayer insulating film 102, as illustrated in FIG. 2. The substrate 100 is, for example, a semiconductor substrate, such as a silicon (Si) substrate, and the substrate 100 corresponds to the wafer W. The interlayer insulating film 102 is, for example, a $SiO_2$ film. The sacrifice layer 103 is, for example, a SiN film formed by CVD, which has a film thickness of 30 nm. The symbol N denotes nitrogen. The number of the sacrifice layers 103 is, for example, 24. The insulating layer 104 is, for example, a $SiO_2$ film formed by CVD, which has a film thickness of 30 nm. The number of the insulating layers 104 is, for example, 24. The sacrifice layers 103 and the insulating layers 104 are used to form memory cells. The sacrifice layer 103 and the insulating layer 104 are examples of first and second layers, respectively.

Figure 3:
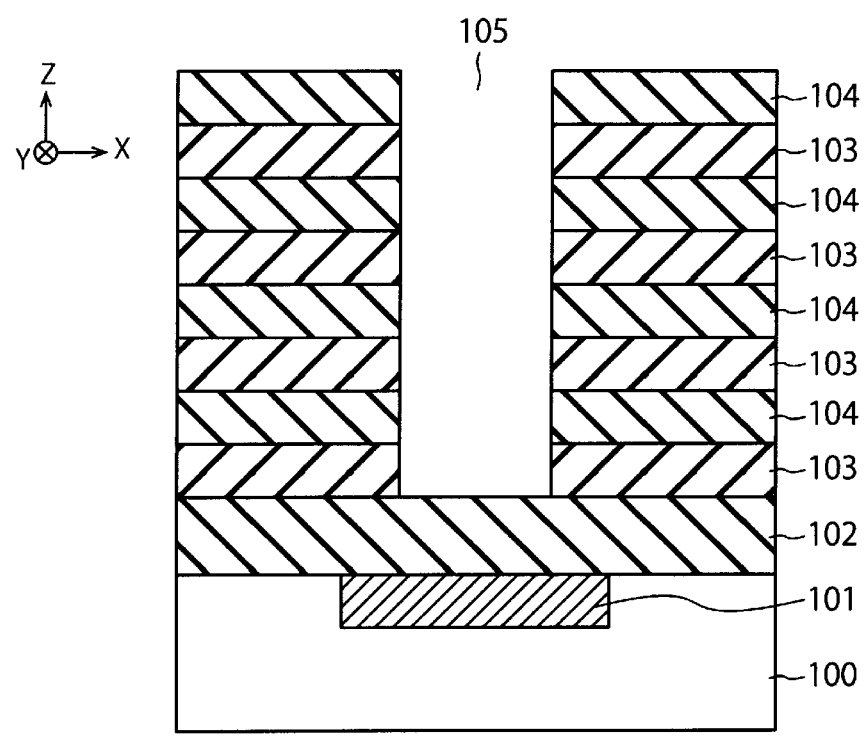

Next, a memory hole 105 is formed in the sacrifice layers 103 and the insulating layers 104, as illustrated in FIG. 3. For example, the memory hole 105 has a diameter of 80 nm and is formed by lithography.

Figure 4:
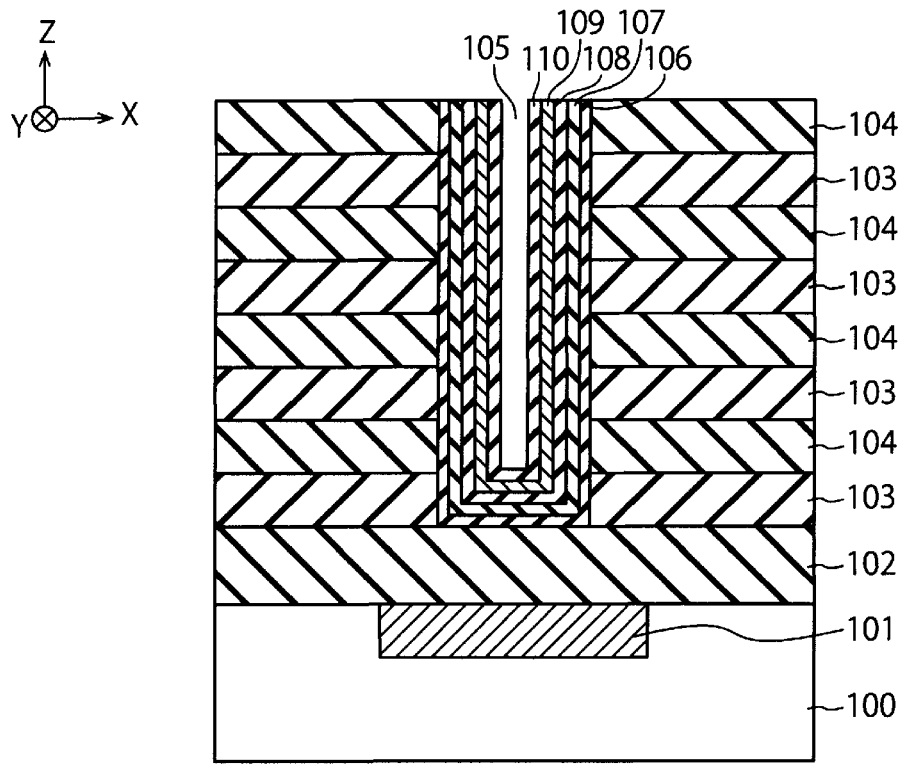

Then, a block insulating film 106, a charge storing layer 107, a tunnel insulating film 108, a channel semiconductor layer 109, and a sidewall insulating film 110 are formed in this order from the surfaces of the sacrifice layers 103 and the insulating layers 104 inside the memory hole 105, as illustrated in FIG. 4. The block insulating film 106 is, for example, an aluminum oxide ($Al_2O_3$) film with a film thickness of 15 nm, which is formed by using trimethylaluminum (TMA) and $O_3$. The charge storing layer 107 is, for example, a SiN film with a film thickness of 5 nm, which is formed by using tris(dimethylamido)silane (3DMAS) and $NH_3$. The tunnel insulating film 108 is, for example, a $SiO_2$ film with a film thickness of 8 nm, which is formed by using 3DMAS and $O_3$. The block insulating film 106, the charge storing layer 107, and the tunnel insulating film 108 are formed by atomic layer deposition (ALD), for example. The channel semiconductor layer 109 is, for example, a poly-silicon layer with a film thickness of 5 nm. The sidewall insulating film 110 is, for example, a $SiO_2$ film with a film thickness of 5 nm.

Figure 5:
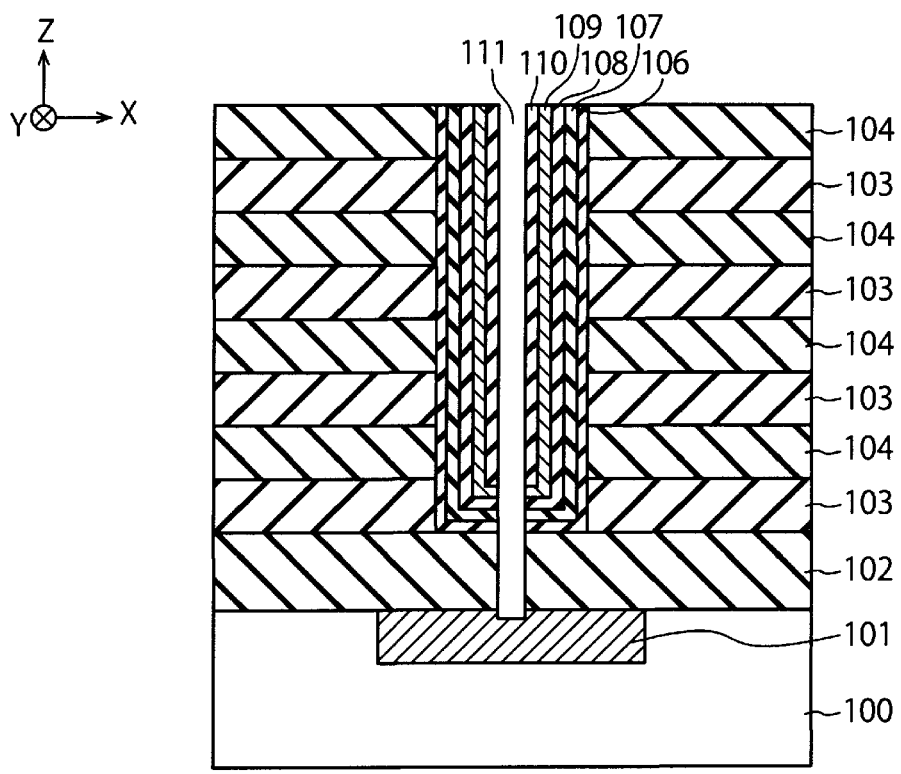

Next, a contact hole 111 is formed by reactive ion etching (RIE) using the sidewall insulating film 110 as a mask so as to penetrate through the sidewall insulating film 110, the channel semiconductor layer 109, the tunnel insulating film 108, and the charge storing layer 107, the block insulating film 106, and the interlayer insulating film 102, as illustrated in FIG. 5. This makes the diffusion layer 101 be exposed in the contact hole 111.

Figure 6:
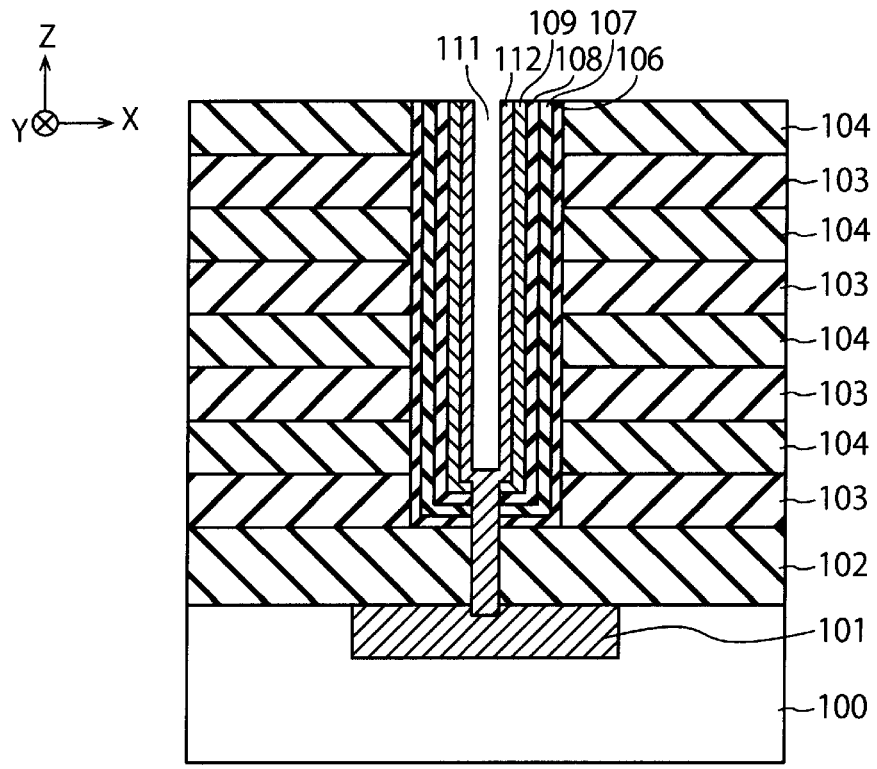

Thereafter, the sidewall insulating film 110 is removed by selective RIE, and a semiconductor layer 112 is further formed on the surfaces of the channel semiconductor layer 109, the tunnel insulating film 108, the charge storing layer 107, the block insulating film 106, the interlayer insulating film 102, and the diffusion layer 101 in the memory hole 105 and in the contact hole 111, as illustrated in FIG. 6. The semiconductor layer 112 is, for example, a polysilicon layer with a film thickness of 5 nm, which is formed so as to completely fill the contact hole 111. The semiconductor layer 112 in the contact hole 111 functions as a contact plug, and the semiconductor layer 112 in the memory hole 105 functions as a channel together with the channel semiconductor layer 109.

Figure 7:
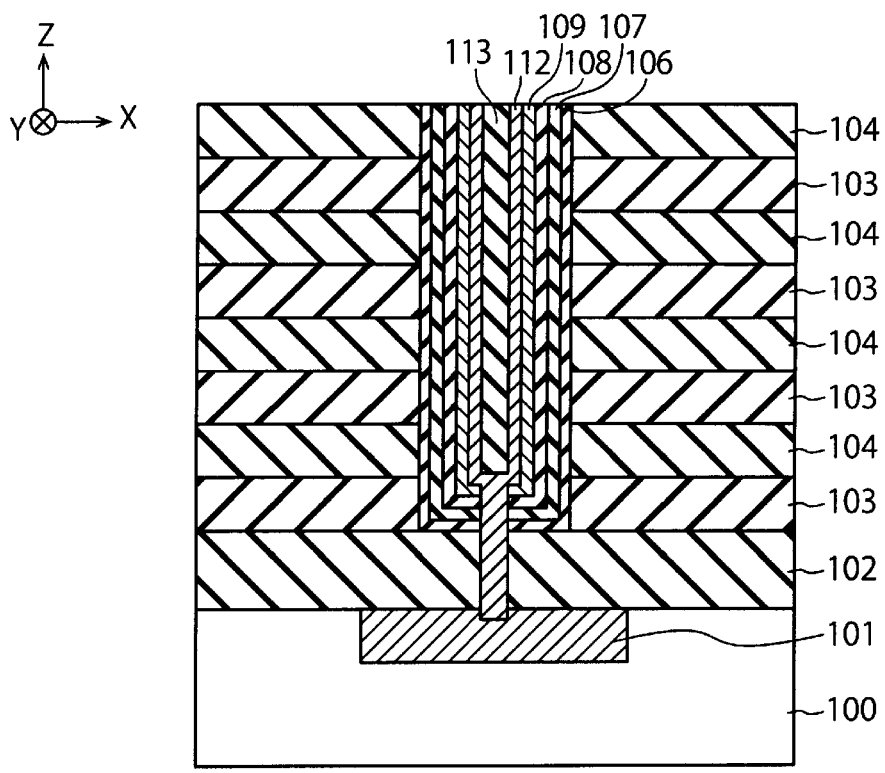

Then, a core insulating film 113 is formed on a surface of the semiconductor layer 112 in the memory hole 105, as illustrated in FIG. 7. The core insulating film 113 is, for example, a $SiO_2$ film, which is formed so as to completely fill the memory hole 105.

Figure 8:
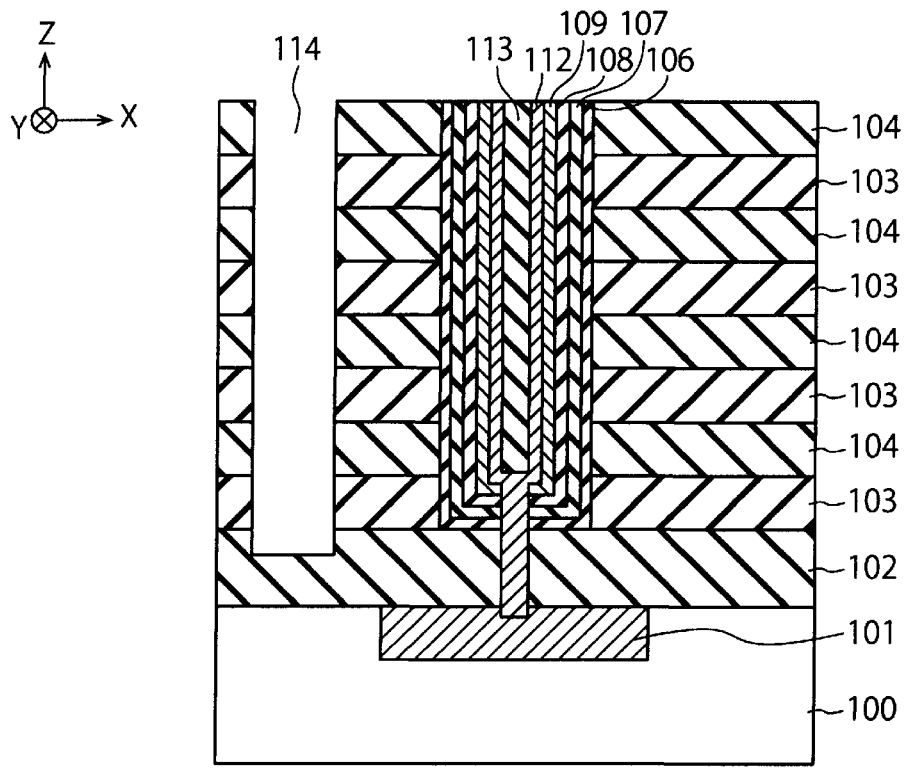

Thereafter, a slit 114 is formed in the sacrifice layers 103 and in the insulating layers 104 by lithography and RIE, as illustrated in FIG. 8.

Figure 9:
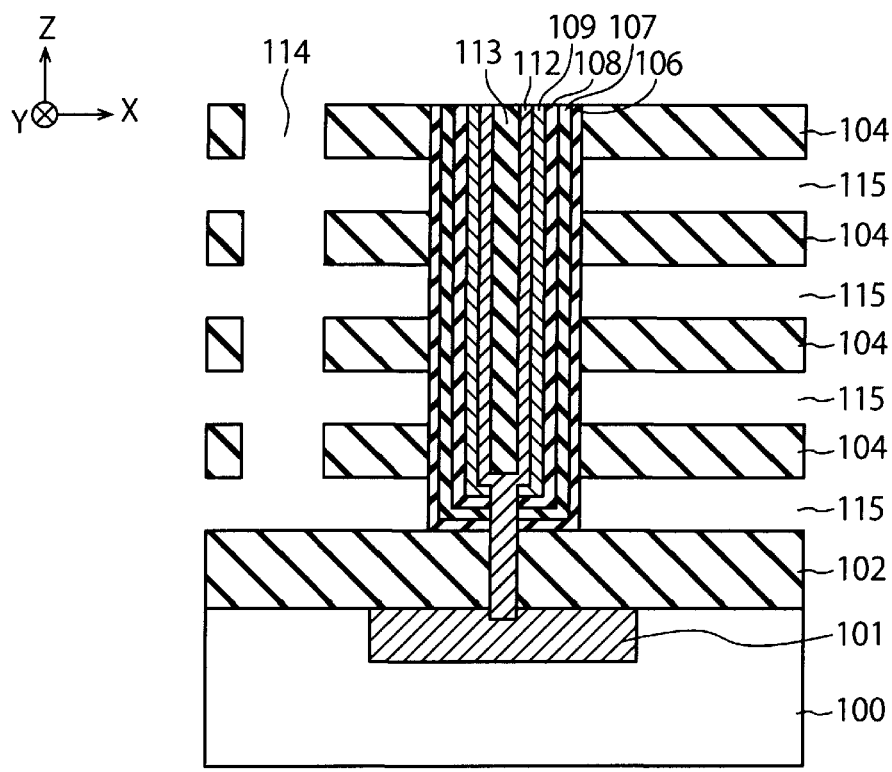

The sacrifice layers 103 are removed through the slit 114 by wet etching using phosphoric acid that is heated to 150° C., as illustrated in FIG. 9. As a result, holes 115 are formed between the insulating layers 104.

Figure 10:
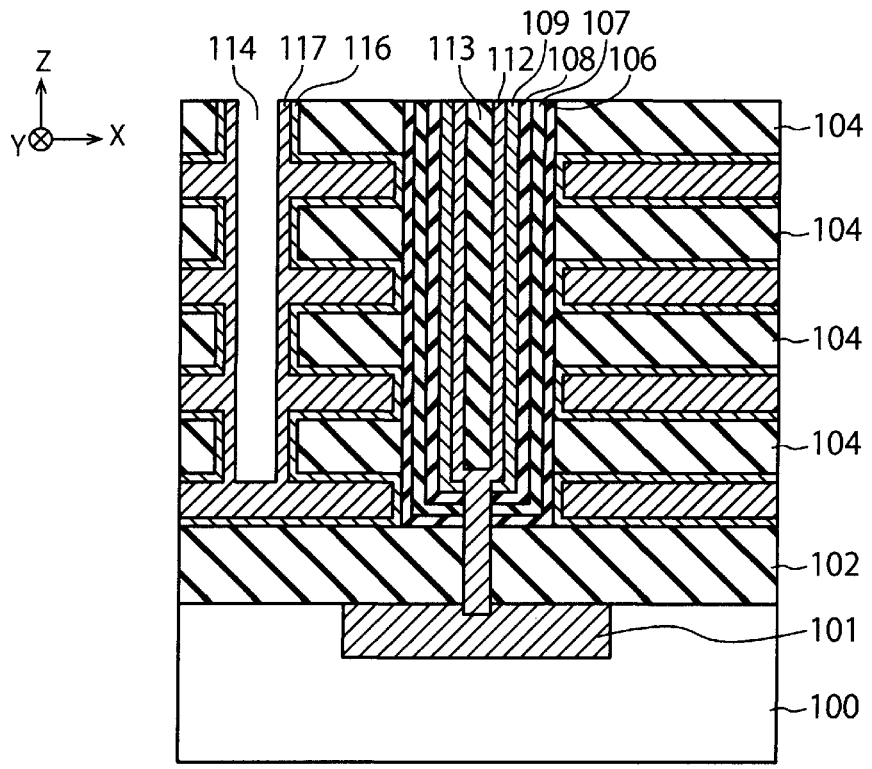

Next, a barrier metal layer 116 and an electrode material layer 117 are formed in this order from the surfaces of the block insulating film 106, the insulating layers 104, and the interlayer insulating film 102 in the slit 114 and in the hole 115, as illustrated in FIG. 10. The barrier metal layer 116 is, for example, a metal layer containing titanium (Ti) or tantalum (Ta). The electrode material layer 117 is, for example, a Mo film, which is formed in the CVD chamber 11 as illustrated in FIG. 1 by using $MoF_6$ gas and $H_2$ gas from the gas supply sources 15a and 15b. The electrode material layer 117 is formed so as to have a film thickness of 30 nm, at 450° C., for example.

Figure 11:
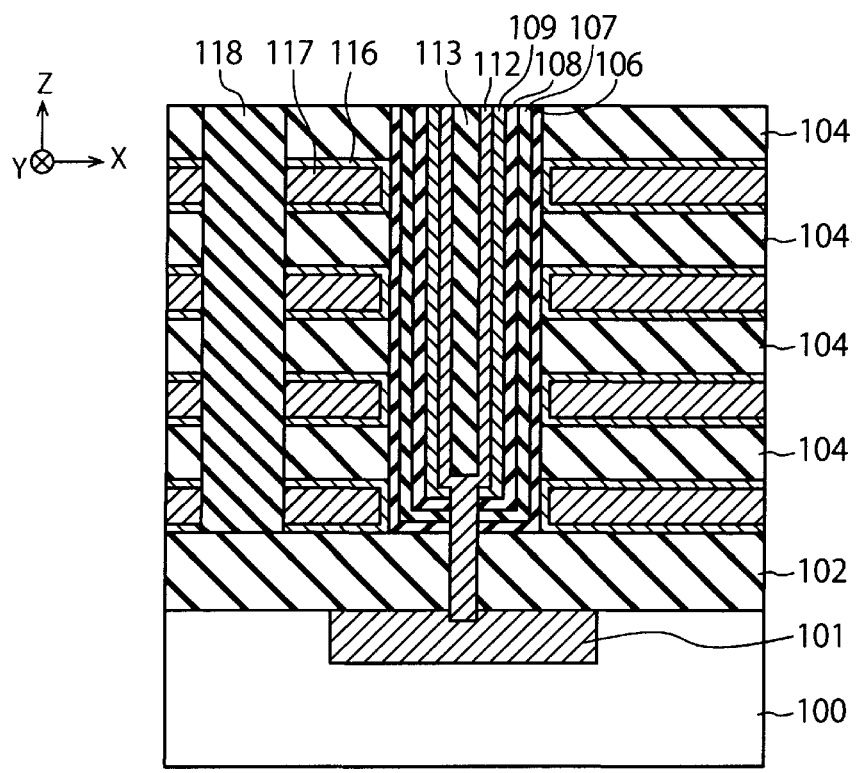

Then, redundant parts of the barrier metal layer 116 and the electrode material layer 117 in the slit 114 are removed, and an insulating film 118 is formed in the slit 114, as illustrated in FIG. 11. The insulating film 118 is, for example, a $SiO_2$ film, which is formed so as to completely fill the slit 114. After these processes, multiple memory cells are formed having a MONOS structure including the electrode material layer 117 and the barrier metal layer 116, the block insulating film 106, the charge storing layer 107, the tunnel insulating film 108, and the channel semiconductor layer 109 and the semiconductor layer 112.

Thereafter, various kinds of wiring layers and interlayer insulating layers are formed over the substrate 100. Thus, the semiconductor device of the present embodiment is manufactured.

In forming the electrode material layer 117 by using $H_2$ gas, $C_2H_2$ gas or $SiH_4$ gas may also be simultaneously supplied in addition to the $H_2$ gas. In addition, in forming the electrode material layer 117, $MoCl_5$ gas or $Mo(CO)_6$ gas may be supplied instead of $MoF_6$ gas.

The following describes details of the electrode material layer 117 of the present embodiment.

In order to improve a degree of integration of a three-dimensional semiconductor memory, for example, the electrode material layer 117 must be thinned. However, thinning the electrode material layer 117 causes increase in the resistance of the electrode material layer 117.

In view of this, the present embodiment uses a Mo film for the electrode material layer 117. This enables keeping the resistance of the electrode material layer 117 low even though the electrode material layer 117 is thinned. However, in the case of making the electrode material layer 117 so as to be formed of the Mo film, when the electrode material layer 117 is formed, the Mo film tends to be deposited on the inner wall of the CVD chamber 11 and other components. The deposited Mo film may come off later, which may cause deposition of particles on the substrate 100.

From this point of view, in the present embodiment, after the substrate 100 that has the electrode material layer 117 formed thereover is taken out from the CVD chamber 11, the semiconductor manufacturing apparatus is cleaned by the method as described above. The following describes details of cleaning of the semiconductor manufacturing apparatus.

In order to clean the semiconductor manufacturing apparatus of the present embodiment, $Cl_2$ gas is supplied from the gas supply source 15c to the CVD chamber 11. In the present embodiment, to accelerate reaction between the deposited Mo film and the $Cl_2$ gas, the RF power source 17 applies high-frequency power of 100 to 1000 W to the showerhead 13. As a result, the deposited Mo film reacts with the $Cl_2$ gas to form gas of molybdenum chloride, in the CVD chamber 11.

In the present embodiment, to prevent molybdenum chloride from being deposited on the inner wall of the CVD chamber 11 and other components, the inner wall of the CVD chamber 11, the space in the CVD chamber 11, the wafer stage 12, the showerhead 13, and the gas discharge piping 18 are heated to 50° C. or higher during cleaning the semiconductor manufacturing apparatus. This increases vapor pressure of molybdenum chloride and makes molybdenum chloride less likely to be re-deposited on the inner wall of the CVD chamber 11 and other components.

For example, the inner wall of the CVD chamber 11 and the space in the CVD chamber 11 are heated to 50 to 100° C. by the heater 11a. The wafer stage 12 is heated to 300 to 500° C. by the heater 12a. The showerhead 13 is heated to 50 to 100° C. by the heater 13a. The gas discharge piping 18 is heated to 50 to 100° C. by the heater 11a. The operations of the heaters 11a, 12a, and 13a are controlled by the controller 19. The temperature of the substrate 100 in forming the electrode material layer 117 over the substrate 100 is set to, for example, approximately 600° C. by the heater 12a.

The present embodiment uses $Cl_2$ gas for removing the deposited Mo film. This $Cl_2$ gas is an example of the second gas. Gas that contains chlorine, such as $Cl_2$ gas, generally has a high vapor pressure. This provides advantageous effects, that is, the Mo film is easily removed, and Mo once removed is less likely to be deposited on the inner wall of the CVD chamber 11 and other components. In the present embodiment, gas with a vapor pressure of 10 torr or higher at 150° C. is desirably used as the gas containing chlorine. In the present embodiment, the flow rate of the $Cl_2$ gas is adjusted to 50 sccm, and the pressure of the $Cl_2$ gas in the CVD chamber 11 is adjusted to 1 torr. While the second gas of the present embodiment contains chlorine, the first gas of the present embodiment may contain chlorine as in the case of $MoCl_5$ gas, or it is not necessary that the first gas contains chlorine, as in the cases of $MoF_6$ gas and $Mo(CO)_6$ gas.

In cleaning the semiconductor manufacturing apparatus of the present embodiment, a mixed gas containing $Cl_2$ gas and $H_2$ gas may be supplied to the CVD chamber 11. This enables accelerating the reaction between the Mo film and the $Cl_2$ gas. An excessive amount of $H_2$ gas may cause reaction between $H_2$ gas and the Mo film and reaction between $H_2$ gas and $O_2$ gas. In consideration of this problem, the ratio of the $H_2$ gas in the mixed gas is desirably less than or equal to 1%.

In cleaning the semiconductor manufacturing apparatus of the present embodiment, a mixed gas containing $Cl_2$ gas and $O_2$ gas may be supplied to the CVD chamber 11. This enables increasing vapor pressure of a product of the reaction between the Mo film and the $Cl_2$ gas. An excessive amount of $H_2$ gas may cause generation of molybdenum oxide, and therefore, the ratio of the $O_2$ gas in the mixed gas is desirably less than or equal to 50%.

The semiconductor manufacturing apparatus of the present embodiment may be cleaned at each time of processing one wafer W or at each time of processing multiple wafers W.

Figure 12:
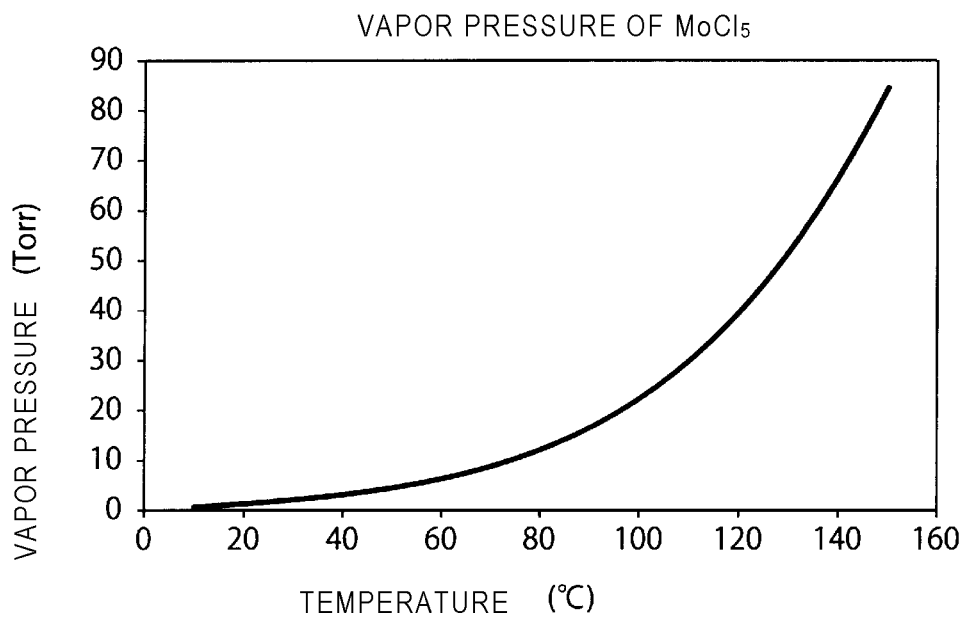
FIG. 12 is a graph to explain the method of manufacturing the semiconductor device according to the first embodiment.

FIG. 12 is a graph to explain the method of manufacturing the semiconductor device according to the first embodiment.

FIG. 12 illustrates a vapor pressure curve of $MoCl_5$. The vapor pressure of $MoCl_5$ is approximately 5 torr at around 50° C. and is approximately 10 torr at 80° C.

As described above, the gas of molybdenum chloride may be re-deposited on the inner wall of the CVD chamber 11 and other components. To effectively prevent this re-deposition, the vapor pressure of the gas of molybdenum chloride is desirably made to be higher than a degree of 2 to 3 torr, and for example, it is desirably 5 torr or higher.

In the case in which the molybdenum chloride is $MoCl_5$, the vapor pressure of the molybdenum chloride is 5 torr or higher by making the molybdenum chloride have a temperature of 50° C. or higher. Other molybdenum chlorides also have a vapor pressure close to that of $MoCl_5$. In view of this, the temperatures of the inner wall of the CVD chamber 11 and other components are set to be 50° C. or higher during clearing, in the first embodiment.

Figure 13:
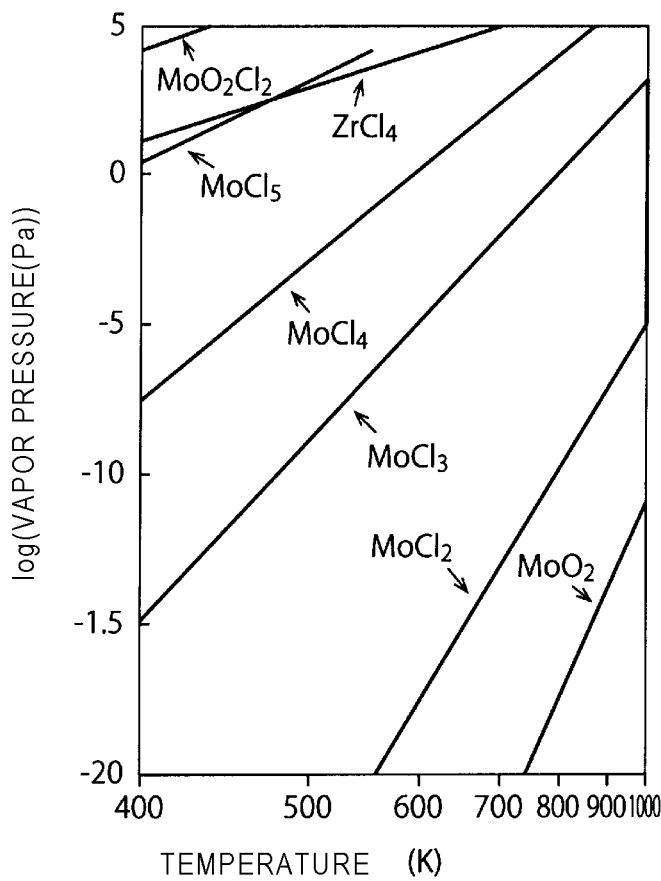
FIG. 13 is another graph to explain the method of manufacturing the semiconductor device according to the first embodiment.

FIG. 13 is another graph to explain the method of manufacturing the semiconductor device according to the first embodiment.

FIG. 13 illustrates temperature dependencies of various kinds of molybdenum chlorides, a molybdenum oxide, and a molybdate compound. As illustrated in FIG. 13, the vapor pressure of $MoO_2Cl_2$ is high, whereas the vapor pressure of $MoO_2$ is low.

As described above, in cleaning the semiconductor manufacturing apparatus of the first embodiment, the mixed gas containing $Cl_2$ gas and $O_2$ gas may be supplied to the CVD chamber 11. At this time, compounds such as $MoO_2Cl_2$ may be generated if the supply amount of $O_2$ is small, whereas compounds such as $MoO_2$ may be generated if the supply amount of $O_2$ is great. In the former case, re-deposition of Mo hardly occurs due to a high vapor pressure of $MoO_2Cl_2$. On the other hand, in the latter case, re-deposition of Mo tends to occur due to low vapor pressure of $MoO_2$. Thus, the ratio of the $O_2$ gas in the mixed gas is desirably not very high, and for example, it is desirably less than or equal to 50%.

As described above, the semiconductor manufacturing apparatus of the first embodiment is cleaned by using the gas containing chlorine after the Mo film is formed over the wafer W. This enables forming a low resistant Mo film as the metal layer of the semiconductor device and also enables preventing deposition of particles on the wafer W due to the Mo film.

More details of the advantageous effects of cleaning in the first embodiment are described below.

The first embodiment uses the Mo films as the multiple electrode material layers 117 that are stacked on the multiple insulating layers 104 in an alternating manner over the substrate 100. This enables keeping the resistance of the electrode material layer 117 low even though the electrode material layer 117 is thinned for improving the degree of integration of the semiconductor device. However, if the Mo film deposited on the semiconductor manufacturing apparatus is left as it is, particles may be deposited on the substrate 100, thereby decreasing the yield of the semiconductor device.

In consideration of this, cleaning is performed to remove the Mo film deposited on the semiconductor manufacturing apparatus, in the first embodiment. At this time, the gas that is produced by the reaction of the Mo film, that is, the reaction product gas, desirably has a high vapor pressure in order to prevent re-deposition of Mo.

The reaction product gas partially remains in the CVD chamber 11 after the Mo film is removed. This reaction product gas may generate impurities, which may be deposited on the substrate 100 in forming the Mo film over a next substrate 100. Thus, the reaction product gas is desirably composed of elements that have a little negative effect on the substrate 100 when deposited on the next substrate 100.

For this reason, the first embodiment uses a chlorine-containing gas, such as $Cl_2$ gas or HCl gas, for removing the Mo film. Chlorine enables preventing re-deposition of Mo by generating a reaction product gas with a high vapor pressure, such as $MoCl_5$, and also enables avoiding the negative effect of the impurities because chlorine generally does not greatly degrade the memory cell at 600° C. or less.

In addition, a compound of molybdenum and chlorine generally does not have a sufficient vapor pressure at room temperatures, but this compound sufficiently evaporates as gas at 50° C. or higher. Thus, in the case of using the chlorine-containing gas for removing the Mo film, the semiconductor manufacturing apparatus is heated to 50° C. or higher. This enables effectively removing the deposited Mo film and effectively preventing re-deposition of Mo. These advantageous effects can be further increased by adding $O_2$ gas or $H_2$ gas to the chlorine-containing gas.

As described above, the first embodiment enables effectively preventing the problem caused by molybdenum deposited on the semiconductor manufacturing apparatus.

Second Embodiment

Figure 14:
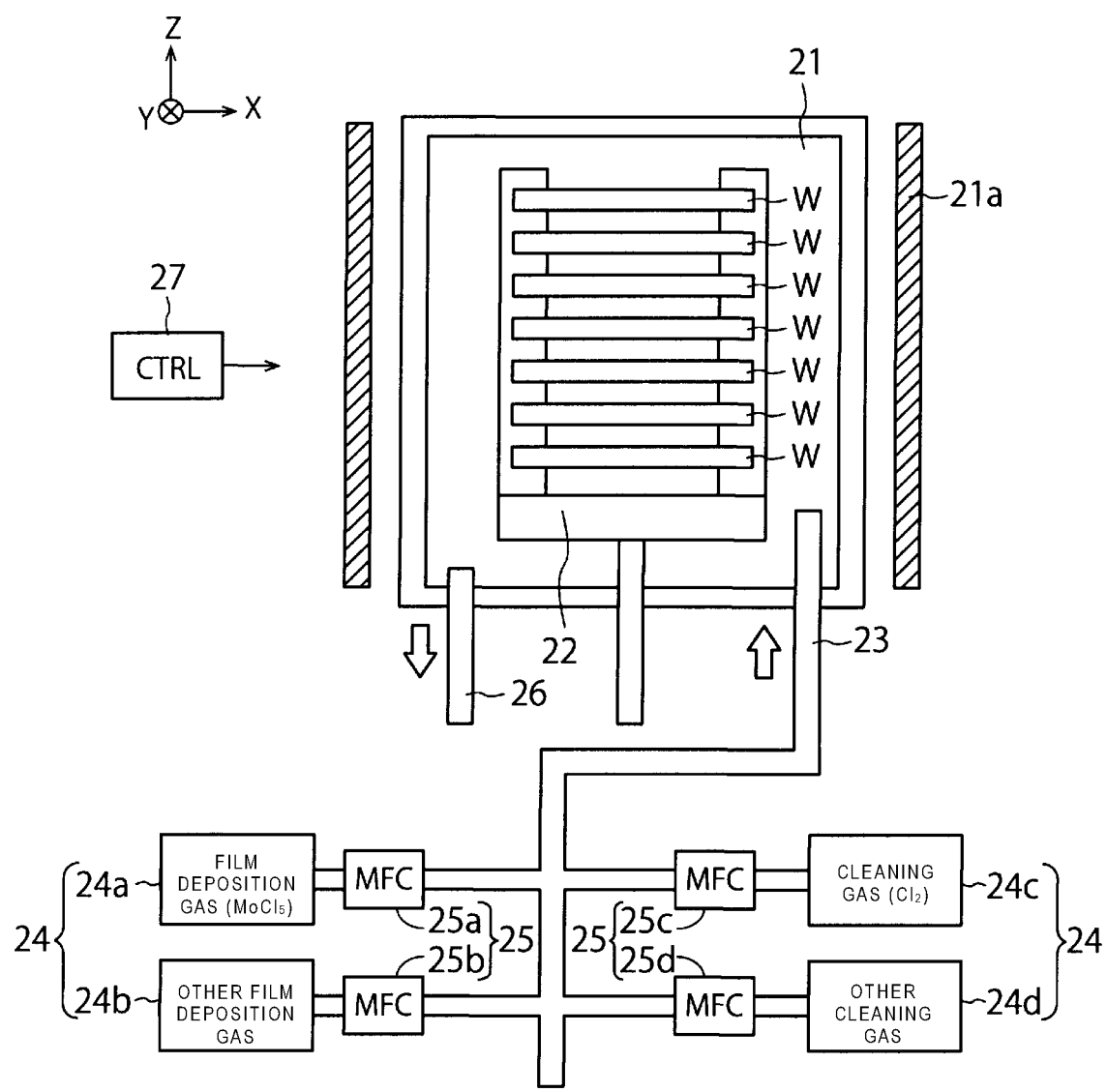
FIG. 14 schematically illustrates a structure of a semiconductor manufacturing apparatus according to a second embodiment.

FIG. 14 schematically illustrates a structure of a semiconductor manufacturing apparatus according to a second embodiment. The semiconductor manufacturing apparatus illustrated in FIG. 14 is, for example, a batch CVD apparatus.

The semiconductor manufacturing apparatus illustrated in FIG. 14 includes a CVD furnace 21, a wafer support fixture 22, a gas introduction piping 23, multiple gas supply sources 24, multiple MFCs 25, a gas discharge piping 26, and a controller 27. The CVD furnace 21 is an example of the housing.

The CVD furnace 21 has a heater 21a. The multiple gas supply sources 24 include gas supply sources 24a and 24b for the film deposition gas and gas supply sources 24c and 24d for the cleaning gas. The multiple MFCs 25 include MFCs 25a and 25b for the film deposition gas and MFCs 25c and 25d for the cleaning gas. Among these gas supply sources 24 and the MFCs 25, the gas supply source 24a and the MFC 25a are examples that make up the first gas supply section, and the gas supply source 24c and the MFC 25c are examples that make up the second gas supply section.

The CVD furnace 21 houses multiple wafers W as substrates. The wafer support fixture 22 supports and rotates these wafers W in the CVD furnace 21. The heater 21a is used to heat an inner wall of the CVD furnace 21, a space in the CVD furnace 21, and the wafers W. The inner wall of the CVD furnace 21 is an example of the structural member of the housing. The heater 21a may also function to heat the gas discharge piping 26.

The structures and functions of the gas introduction piping 23, the gas supply sources 24, the MFCs 25, the gas discharge piping 26, and the controller 27 are respectively similar to the structures and functions of the gas introduction piping 14, the gas supply sources 15, the MFCs 16, the gas discharge piping 18, and the controller 19 in FIG. 1. The controller 27 controls, for example, carrying the wafers W into the CVD furnace 21, carrying the wafers W out from the CVD furnace 21, rotating the wafer support fixture 22, supplying gases from the gas supply sources 24, and operations of the MFCs 25.

The controller 27 also controls operation of the heater 21a at the time of cleaning the semiconductor manufacturing apparatus. Specifically, the controller 27 controls the heater 21a to heat the space in the CVD furnace 21 to 300 to 500° C. This enables preventing re-deposition of molybdenum chloride on the inner wall of the CVD furnace 21 and other components.

The types of the gases that are supplied from the gas supply sources 24a to 24d are similar to those of the gases that are supplied from the gas supply sources 15a to 15d in FIG. 1. The gas supply source 24c supplies, for example, $Cl_2$ gas or HCl gas. The gas supply source 24d supplies, for example, at least either one of $H_2$ gas and $O_2$ gas. The gases from the gas supply sources 24a to 24d are supplied to the CVD furnace 21 via the MFCs 25a to 25d, respectively. In cleaning in the second embodiment, for example, the flow rate of HCl gas is adjusted to 200 sccm, and the pressure of HCl gas in the CVD furnace 21 is adjusted to 20 torr. The method of manufacturing the semiconductor device illustrated in FIGS. 2 to 11 may be implemented by using the semiconductor manufacturing apparatus of the second embodiment.

As in the case of the first embodiment, the second embodiment enables effectively preventing the problem caused by molybdenum deposited on the semiconductor manufacturing apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
    placing a substrate in a housing;
    supplying first gas containing molybdenum to the housing to form a film that contains molybdenum, on the substrate;
    removing the substrate with the formed film from the housing; and
    after the substrate with the formed film is removed from the housing, supplying second gas containing chlorine to the housing to remove molybdenum deposited on a surface of the housing.

2. The method according to claim 1, wherein the second gas has a vapor pressure of 10 torr or higher at 150° C.

3. The method according to claim 1, wherein the second gas contains $Cl_2$ gas or HCl gas.

4. The method according to claim 1, wherein said supplying the second gas comprises supplying mixed gas containing the second gas and at least one of $H_2$ gas and $O_2$ gas to the housing.

5. The method according to claim 4, wherein the mixed gas contain the $O_2$ gas, and a ratio of the $O_2$ gas in the mixed gas is less than or equal to 50%.

6. The method according to claim 4, wherein the mixed gas contain the $H_2$ gas, and a ratio of the $H_2$ gas in the mixed gas is less than or equal to 1%.

7. The method according to claim 1, further comprising:
    heating at least one of a structural member of the housing, a space in the housing, a component in the housing, and piping for discharging gas from the housing, to 50° C. or higher while the second gas is supplied to the housing.

8. The method according to claim 1, further comprising:
    forming multiple first layers and multiple second layers alternately on the substrate; and
    forming multiple holes between the second layers by removing the first layers;
    wherein the film is formed in each of the multiple holes.

9. The method according to claim 1, wherein
    said placing the substrate in the housing comprises placing the substrate on a stage,
    said supplying the first gas comprises supplying the first gas through a shower head that is provided in the housing and faces the stage, and
    said supplying the second gas comprises supplying the second gas through the shower head.

10. The method according to claim 1, wherein said placing the substrate in the housing comprises placing a plurality of substrates set in a rack structure in the housing, and the substrate is one of the plurality of substrates.

* * * * *